(12) United States Patent
Takigawa et al.

(10) Patent No.: US 9,685,758 B2
(45) Date of Patent: Jun. 20, 2017

(54) LASER SYSTEM HAVING FAULT DIAGNOSIS FUNCTION

(71) Applicant: FANUC CORPORATION, Yamanashi (JP)

(72) Inventors: Hiroshi Takigawa, Yamanashi (JP); Hisatada Machida, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/346,185

(22) Filed: Nov. 8, 2016

(65) Prior Publication Data

US 2017/0133819 A1    May 11, 2017

(30) Foreign Application Priority Data

Nov. 9, 2015  (JP) .................................. 2015-219445

(51) Int. Cl.
| | |
|---|---|
| *H01S 5/00* | (2006.01) |
| *H01S 5/40* | (2006.01) |
| *H01S 5/0683* | (2006.01) |
| *H01S 5/042* | (2006.01) |
| *H01S 5/024* | (2006.01) |

(52) U.S. Cl.
CPC ........ *H01S 5/0021* (2013.01); *H01S 5/02469* (2013.01); *H01S 5/042* (2013.01); *H01S 5/0683* (2013.01); *H01S 5/4012* (2013.01)

(58) Field of Classification Search
CPC ...... H01S 5/042; H01S 5/4012; H01S 5/0683; H01S 5/02469
USPC .................................................. 372/38.01, 36
See application file for complete search history.

(56) References Cited

FOREIGN PATENT DOCUMENTS

| | | | |
|---|---|---|---|
| JP | H 06-160237 A | | 6/1994 |
| JP | 2005-317841 A | | 11/2005 |
| JP | 2007-214170 A | | 8/2007 |
| JP | 4341600 | * | 10/2009 |
| JP | 2012-124304 | * | 6/2012 |
| JP | 5729107 | * | 6/2015 |

* cited by examiner

*Primary Examiner* — Tuan Nguyen
(74) *Attorney, Agent, or Firm* — RatnerPrestia

(57) ABSTRACT

A laser system having an automatic diagnosis function enabling a plurality of laser diodes to be diagnosed for faults in a short time.
The laser system includes a judging part judging the presence of a fault or deterioration of a component of the laser system. The judging part is configured to judge the presence of a fault or deterioration of a component of the laser system based on the results of detection of a first photodetection part and second photodetection part when successively driving a plurality of laser diode module groups included in an individual laser oscillation unit so that the mutual drive times do not overlap simultaneously for at least two laser oscillation units among a plurality of laser oscillation units.

13 Claims, 16 Drawing Sheets

LASER SYSTEM HAVING FAULT DIAGNOSIS FUNCTION

BACKGROUND OF THE INVENTION

1. Field of the Invention

The present invention relates to a laser system utilizing a laser diode as a light source or excitation light source.

2. Description of the Related Art

Known in the art is a laser system having a fault diagnosis function (see Japanese Patent Publication No. 2007-214170A and Japanese Patent Publication No. 6-160237). Further, it is known to adjust the amount of current supplied to a laser diode device to secure longer service life of the laser system (see Japanese Patent Publication No. 2005-317841).

A laser system where a high output power is sought utilizes a large number of laser diode modules acting as light sources or excitation light sources. However, in the past methods, along with the increase in number of laser diodes covered by fault diagnosis, the time required for fault diagnosis tended to become longer.

SUMMARY OF INVENTION

A laser system having a fault diagnosis function enabling fault diagnosis of a plurality of laser diodes in a short time is therefore sought.

According to the present invention, there is provided a laser system comprising a plurality of laser oscillation units and configured to combine laser light emitted from the plurality of laser oscillation units for emission to the outside, wherein each of the laser oscillation units includes a plurality of laser diode module groups each including at least one laser diode module acting as a light source or excitation light source, a first optical coupling part combining the laser light emitted from the plurality of laser diode module groups, and at least one first photodetection part detecting the output power of laser light combined by the first optical coupling part, the laser system includes a second optical coupling part combining the laser light emitted from the plurality of laser oscillation units, at least one second photodetection part detecting the output of the laser light combined by the second optical coupling part, power supply parts that are able to supply driving current to the plurality of laser diode module groups independently from each other, a recording part recording optical output characteristics showing the relationship between driving current and output power of laser light at each of the laser diode module groups, a control part commanding the driving conditions showing the driving current to be supplied to each of the laser diode module groups to the power supply parts, a judging part judging any fault or deterioration of the components of the laser system, and an operating part used for setting the driving conditions, and the judging part is configured to judge, simultaneously for at least two laser oscillation units among the plurality of laser oscillation units, any fault or deterioration of the components of the laser system based on the results of detection of the first photodetection part and the second photodetection part when successively driving the plurality of laser diode module groups included in each of the laser oscillation units so that their drive times do not overlap.

In a preferred embodiment, the control part is configured to set the driving conditions so that the driving current supplied to each of the laser diode module groups changes continuously or in stages when the judgment by the judging part is performed.

In a preferred embodiment, the control part is configured to set the driving conditions so that a drive cycle for successively driving the plurality of laser diode module groups included in each of the laser oscillation units so that their drive times do not overlap is performed several times while changing the driving current supplied to each of the laser diode module groups when judgment by the judging part is performed.

In a preferred embodiment, wherein when judgment by the judging part is performed, a laser beam emitting end of the laser system is configured to move to a retracted position so that the laser beam emitted from the laser system to the outside is absorbed at a light absorbing part.

In a preferred embodiment, the light absorbing part includes a third photodetection part measuring the optical output of laser beam incident on the light absorbing part.

In a preferred embodiment, each laser oscillation unit includes a plurality of first photodetection parts.

In a preferred embodiment, the laser system includes at least two second photodetection parts.

In a preferred embodiment, each of the laser oscillation units further comprises a cooling plate cooling the at least one laser diode module and a temperature detector detecting the temperature of the cooling plate, and the judging part is configured to judge any fault or deterioration of the components of the laser system based further on the results of detection of the temperature detector.

In a preferred embodiment, the judging part is configured to judge any fault or deterioration of the components of the laser system at a predetermined time period.

In a preferred embodiment, the recording part is configured so that the optical output characteristics recorded by the recording part are overwritten by using optical output characteristics newly acquired when judgment by the judging part is performed.

In a preferred embodiment, the recording part is configured to record additional optical output characteristics newly acquired when judgment by the judging part is performed.

In a preferred embodiment, the recording part is configured to record the additional optical output characteristics along with the acquisition time.

In a preferred embodiment, the laser system includes a display part displaying results of judgment by the judging part.

BRIEF DESCRIPTION OF THE DRAWINGS

These and other objects, features, and advantages of the present invention will become clearer by referring to the detailed description relating to illustrative embodiments of the present invention shown in the attached drawings.

DETAILED DESCRIPTION

Below, embodiments of the present invention will be explained with reference to the attached drawings. The components of the illustrated embodiments are suitably changed in scale to assist in understanding the present invention. The same reference notations are used for the same or corresponding components.

Figure 1:
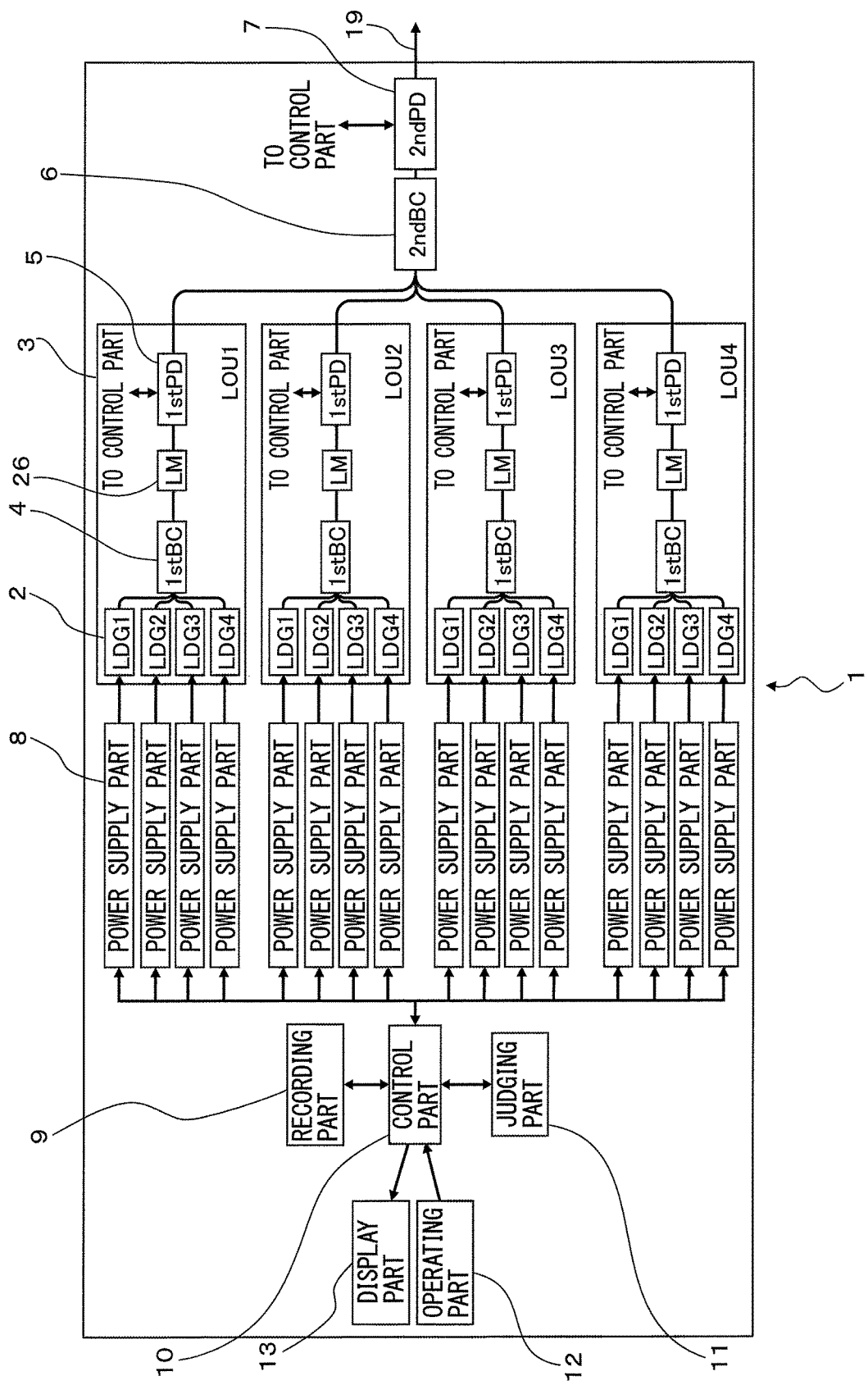
FIG. 1 is a view showing the configuration of a laser system according to a first embodiment.

FIG. 1 is a block diagram showing the configuration of a laser system 1 according to a first embodiment. The laser system 1 is configured to receive the supply of driving current and emit laser beam 19 to the outside. The laser system 1 is for example used for cutting sheet metal or for welding.

The laser system 1 includes four laser oscillation units 3. Each laser oscillation unit 3 includes four laser diode module groups 2, a first optical coupling part 4, and a first photodetection part 5.

Each laser diode module group 2 includes at least one laser diode module receiving the supply of driving current and emitting laser light.

The first optical coupling part 4 is provided for combining laser light output from the four laser diode module groups 2 of the laser oscillation unit 3.

The first photodetection part 5 is provided for detecting the optical output of the laser oscillation unit 3.

Between the first optical coupling part 4 and the first photodetection part 5, a laser medium 26 is set. The laser medium 26 is an optical crystal doped with an active element which is excited by laser light and causes stimulated emission.

The laser system 1 further includes a second optical coupling part 6, second photodetection part 7, power supply parts 8, a recording part 9, control part 10, judging part 11, operating part 12, and display part 13.

The second optical coupling part 6 is provided for combining the laser light emitted from the four laser oscillation units 3.

The second potodetection part 7 is provided for detecting the optical output of the laser system 1.

The power supply parts 8 supply driving current to the laser diode modules forming the laser diode module groups 2 in accordance with commands from the control part 10. The power supply parts 8 are individually provided for the respective laser diode module groups 2. Due to this, the laser diode module groups 2 are able to be supplied with driving current independently from each other.

The recording part 9 records the relationship between the driving currents supplied to the laser diode module groups 2 and the optical outputs of the laser light emitted from the corresponding laser diode module groups 2 (below, sometimes referred to as "optical output characteristics"). There are individual differences in the optical output characteristics of the laser diode module groups 2. Further, the characteristics also change in accordance with the degree of deterioration, so the recording part 9 records the optical output characteristics of the individual laser diode module groups 2.

The control part 10 prepares commands for the power supply parts 8 in accordance with a predetermined control program and optical output characteristics stored in advance in the recording part 9. Due to this, the desired optical outputs are obtained from the laser diode module groups 2. The driving currents determined by the control part 10 will sometimes be referred to as the "driving conditions" of the corresponding laser diode module groups.

The judging part 11 judges any fault or deterioration of the components of the laser system 1.

The operating part 12 is used for manually setting the driving conditions.

The display part 13 displays the results of judgment by the judging part 11. The judgment results are for example displayed on a not shown display device, for example, a liquid crystal display.

Figure 2:
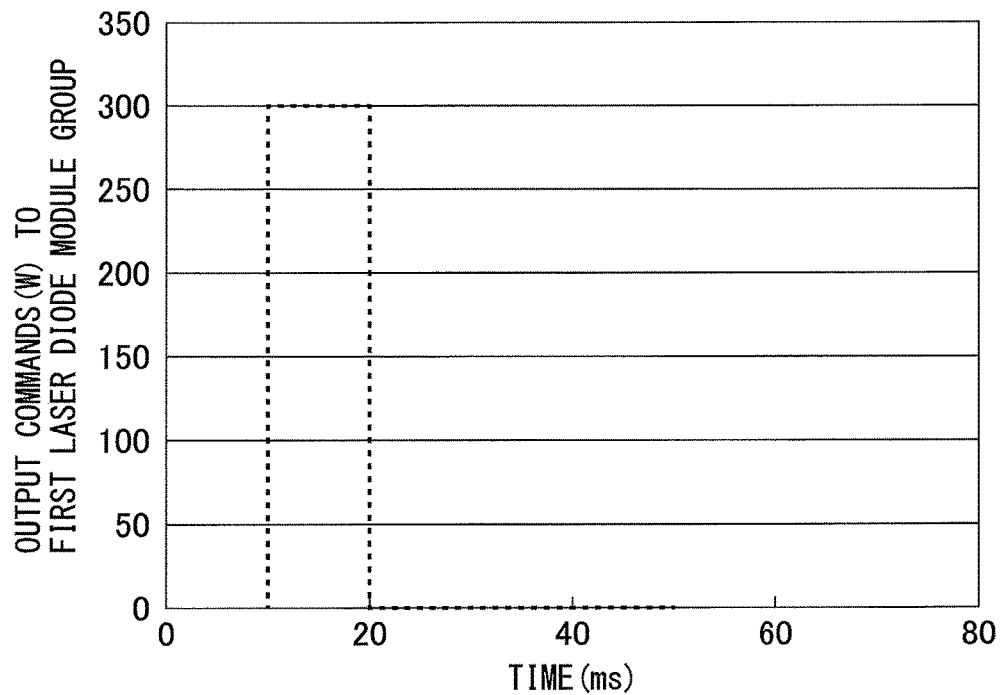
FIG. 2 is a view showing an output command to a first laser diode module group in a first embodiment.
Figure 3:
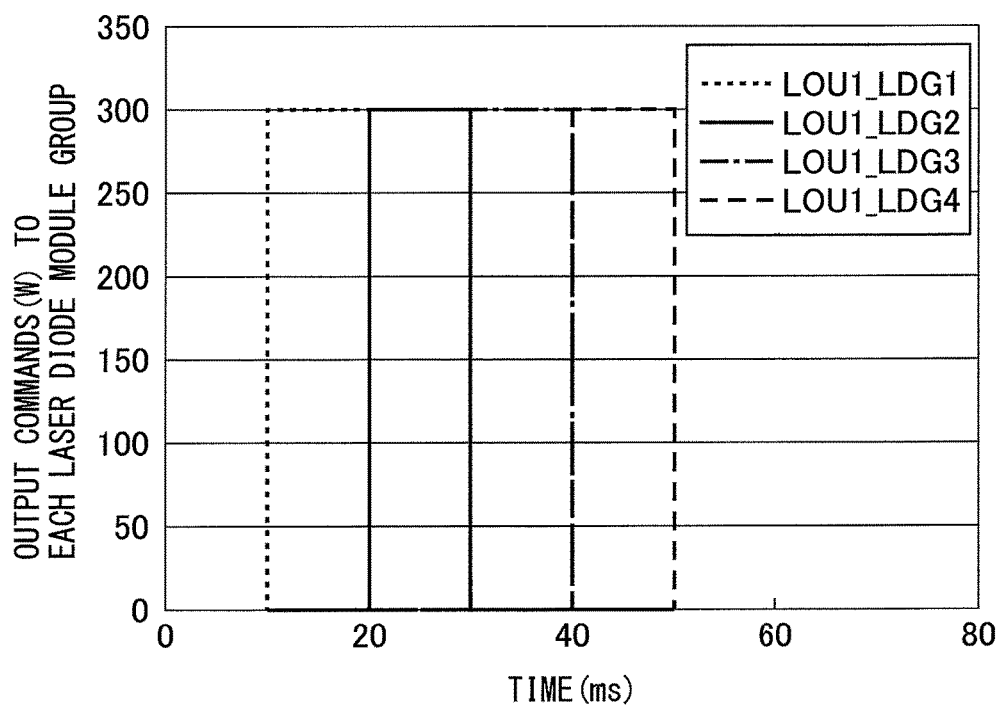
FIG. 3 is a view showing output commands to first to fourth laser diode module groups in the first embodiment.

Referring to FIG. 2 and FIG. 3, the output commands utilized in the fault diagnosis performed in accordance with the present embodiment will be explained. FIG. 2 shows only the output command for the first laser diode module group LDG1 of each laser oscillation unit 3. As shown in FIG. 2, the control part 10 gives a 300W output command to the power supply part 8 corresponding to the first laser diode module group LDG1 for 10 ms to 20 ms.

FIG. 3 shows the output commands for the first to fourth laser diode module groups LDG1 to LDG4 of each laser oscillation unit 3 in a superposed state. As shown in FIG. 3, the control part 10 gives the power supply part 8 corresponding to the second laser diode module group LDG2 a 300W output command between 20 ms and 30 ms. That is, the second laser diode module group LDG2 is offset in drive time from the first laser diode module group LDG1.

Similarly, the third laser diode module group LDG3 and the fourth laser diode module group LDG4 are also offset in drive times from the other laser diode module groups.

Figure 4:
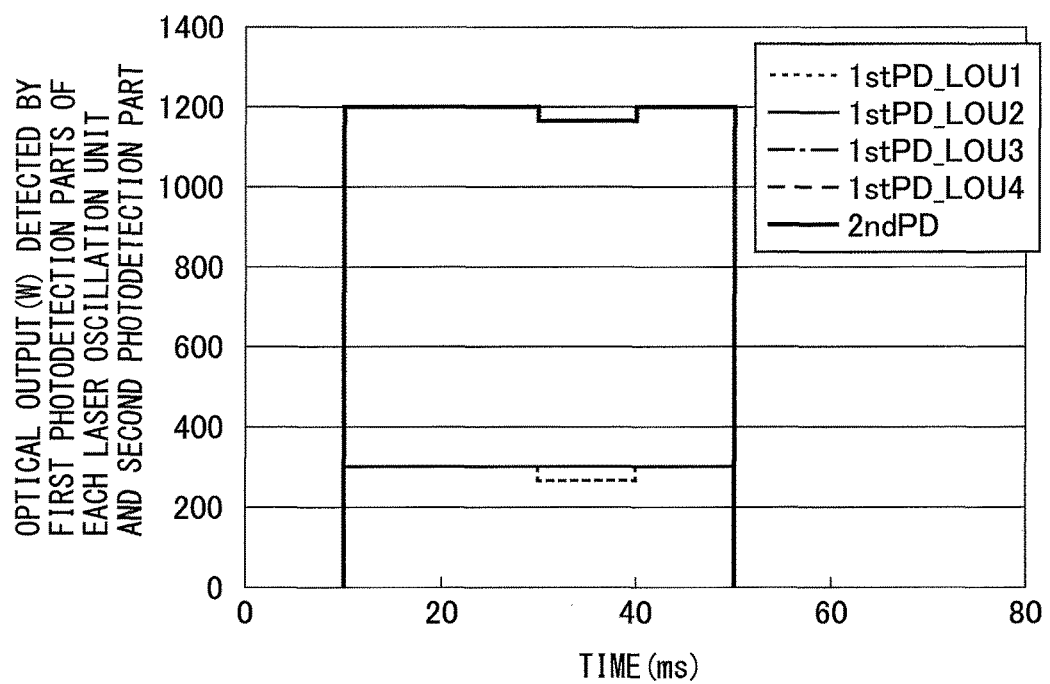
FIG. 4 is a view showing optical output obtained from detection values of a first photodetection part and second photodetection part in the first embodiment.

FIG. 4 shows the optical output obtained from detection value of the first photodetection part 5 and the optical output obtained from detection value of the second photodetection part 7 when output commands such as in FIG. 3 are simultaneously given to the laser diode module groups 2 of the laser oscillation units 3 in the individual laser oscillation units 3. In FIG. 4, "1stPD LOU1" means the first photodetection part 5 of the first laser oscillation unit 3. Further, "1stPD LOU2", "1stPD LOU3", and "1stPD LOU4" respectively mean the first photodetection parts 5 of the second laser oscillation unit 3, third laser oscillation unit, and fourth laser oscillation unit 3.

In the example shown in FIG. 4, at the time 30 ms to 40 ms, the optical output obtained from detection value of the first photodetection part 5 and the optical output obtained from detection value of the second photodetection part 7 of the first laser oscillation unit LOU1 both fall about 10% from the 300W output command. This suggests the possibility of a fault in the third laser diode module group LDG3 of the first laser oscillation unit LOU1 driven third, that is, supplied with driving current at the time 30 ms to 40 ms.

Figure 5:
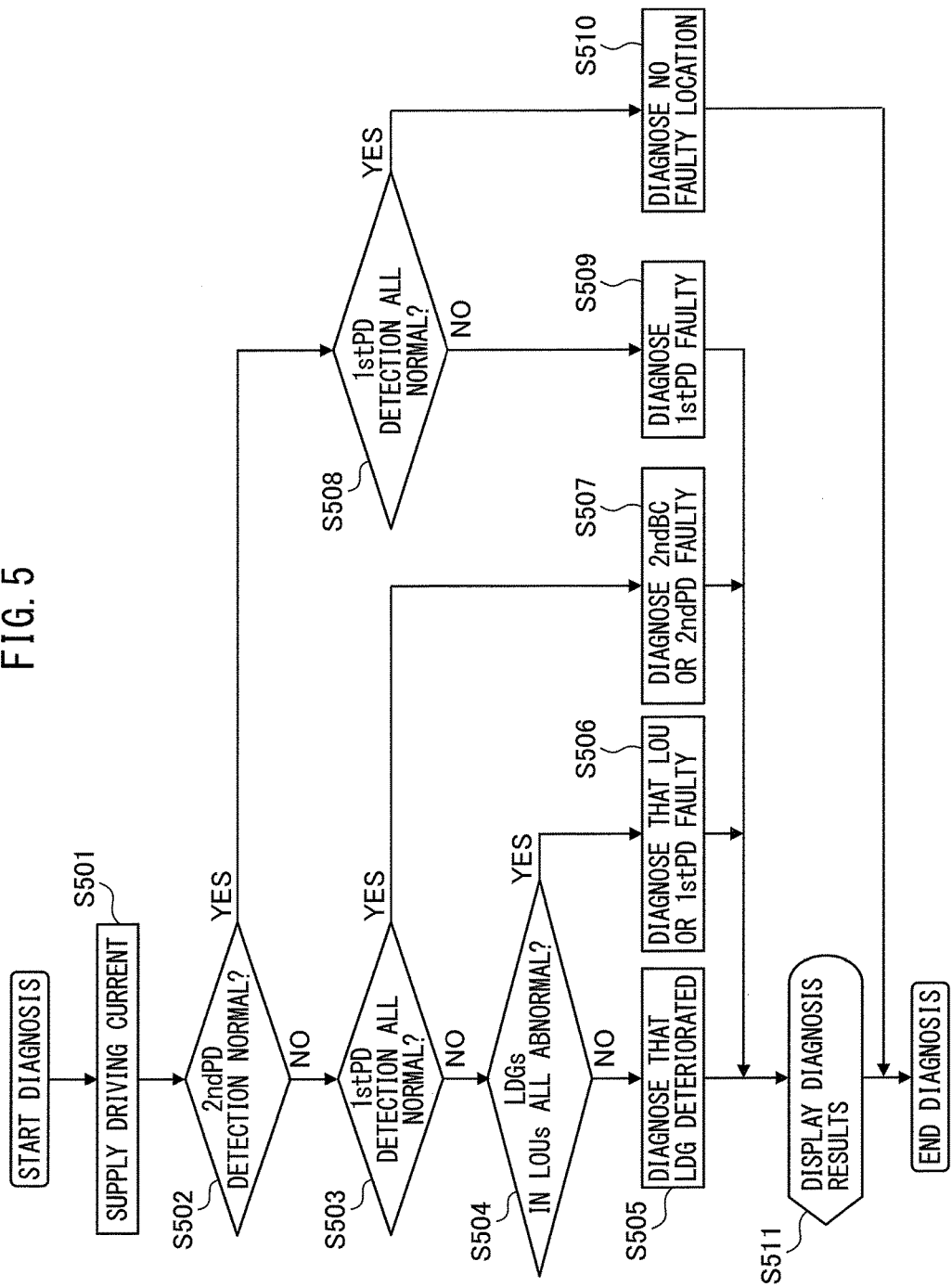
FIG. 5 is a flow chart showing a fault diagnosis process performed in the laser system according to the first embodiment.

Referring to FIG. 5, the diagnosis processing performed in the present embodiment will be explained. When the diagnosis processing is started, the power supply parts 8 supply driving current to the laser diode module groups 2 in accordance with commands from the control part 10 (step S501). At this time, the output commands generated by the control part 10 are designed so that, as explained above in relation to FIG. 2 and FIG. 3, among the laser diode module groups LDG1 to LDG4 designated as the first to fourth groups included in the laser oscillation units LOU1 to LOU4, the laser diode module groups of the same numbers included in different laser oscillation units are driven at the same time while the laser diode module groups LDG1 to LDG4 assigned different numbers have drive times not overlapping with each other.

At step S502, it is judged if the detection value of the second photodetection part 7 is normal. Whether the detection value of the second photodetection part 7 is normal is judged in accordance with the optical output characteristics recorded in the recording part 9.

When the result of judgment of step S502 is negative, that is, when it is judged that the detection value of the second photodetection part 7 is not normal, the routine proceeds to step S503. At step S503, it is judged if all of the detection values of all of the first photodetection parts 5 are normal.

When the result of judgment of step S503 is negative, that is, when it is judged that the detection value of one or more of the first photodetection parts 5 is not normal, the routine proceeds to step S504. At step S504, it is judged if all of the laser diode module groups 2 are abnormal.

If the result of judgment of step S504 is negative, that is, if one or more of the laser diode module groups 2 is normal, the routine proceeds to step S505. At step S505, the judging part 11 judges that a laser diode module group 2 judged not normal at step S504 has deteriorated.

On the other hand, when the result of judgment at step S504 is affirmative, that is, when it is judged that all of the laser diode module groups 2 are abnormal, the routine proceeds to step S506. At step S506, the judging part 11 judges that the laser oscillation unit 3 or first photodetection part 5 is faulty.

Further, when the result of judgment at step S503 is affirmative, that is, when it is judged that the detection values of all of the first photodetection parts 5 are normal, the routine proceeds to step S507. At step S507, the judging part 11 judges that the second optical coupling part 6 or second photodetection part 7 is faulty.

When the result of judgment at step S502 is affirmative, that is, when the detection value of the second photodetection part 7 is normal, the routine proceeds to step S508 where it is judged if the detection values of all of first photodetection parts 5 are normal.

If the result of judgment at step S508 is negative, that is, it is judged that the detection value of one or more of the first photodetection parts 5 is not normal, the routine proceeds to step S509. At step S509, the judging part 11 judges that the first photodetection part 5 judged not normal is faulty.

If the result of judgment at step S508 is affirmative, that is, if it is judged that the detection values of all of the first photodetection parts 5 are normal, the judging part 11 judges that no fault has occurred at the laser system 1.

The results of judgment of the judging part 11 at steps S505, S506, S507, S509, and S510 are displayed at the display device by the display part 13 (step S511).

According to the laser system 1 according to the present embodiment, the judgment of faults of the laser diode module groups, optical coupling parts, and photodetection parts forming the laser system 1 can be performed in a short time. For example, in the case of a comparative example individually driving the laser diode module groups for diagnosis, if designating the number of the laser oscillation units as "m", the number of the laser diode module groups in the laser oscillation unit as "n", and the time required for diagnosing one laser diode module group as "t", a time of "n×m×t" is required for completion of the fault diagnosis.

As opposed to this, according to the present embodiment, the fault diagnosis can be completed in a time of "n×t". Due to this, fault diagnosis can be performed more frequently. Therefore, it is possible to prevent a drop in the operating rate of the laser system due to sudden faults and measures taken against them.

The laser system shown in FIG. 1 includes four laser oscillation units 3. Each laser oscillation unit 3 includes four laser diode module groups 2. However, the invention is not limited to the illustrated example. The laser system 1 may include any number of laser oscillation units 3 from two and up. Further, each laser oscillation unit 3 may include any number of laser diode module groups 2 from two and up.

Further, in another embodiment, a third optical coupling part is included. Due to this, the plurality of laser light collected by the second optical coupling part 6 may also be further collected by the third optical coupling part. In this case, to detect the optical output from the third optical coupling part, a third photodetection part may be further included. In this way, an additional optical coupling part and photodetection part may be further added.

The laser system 1 requires an optical crystal or optical fiber or other laser medium doped with an active element excited by laser light and causing stimulated emission, but the laser system 1 according to another embodiment may also be configured to utilize the light emitted from the laser diode module groups 2 as direct light sources.

Figure 6:
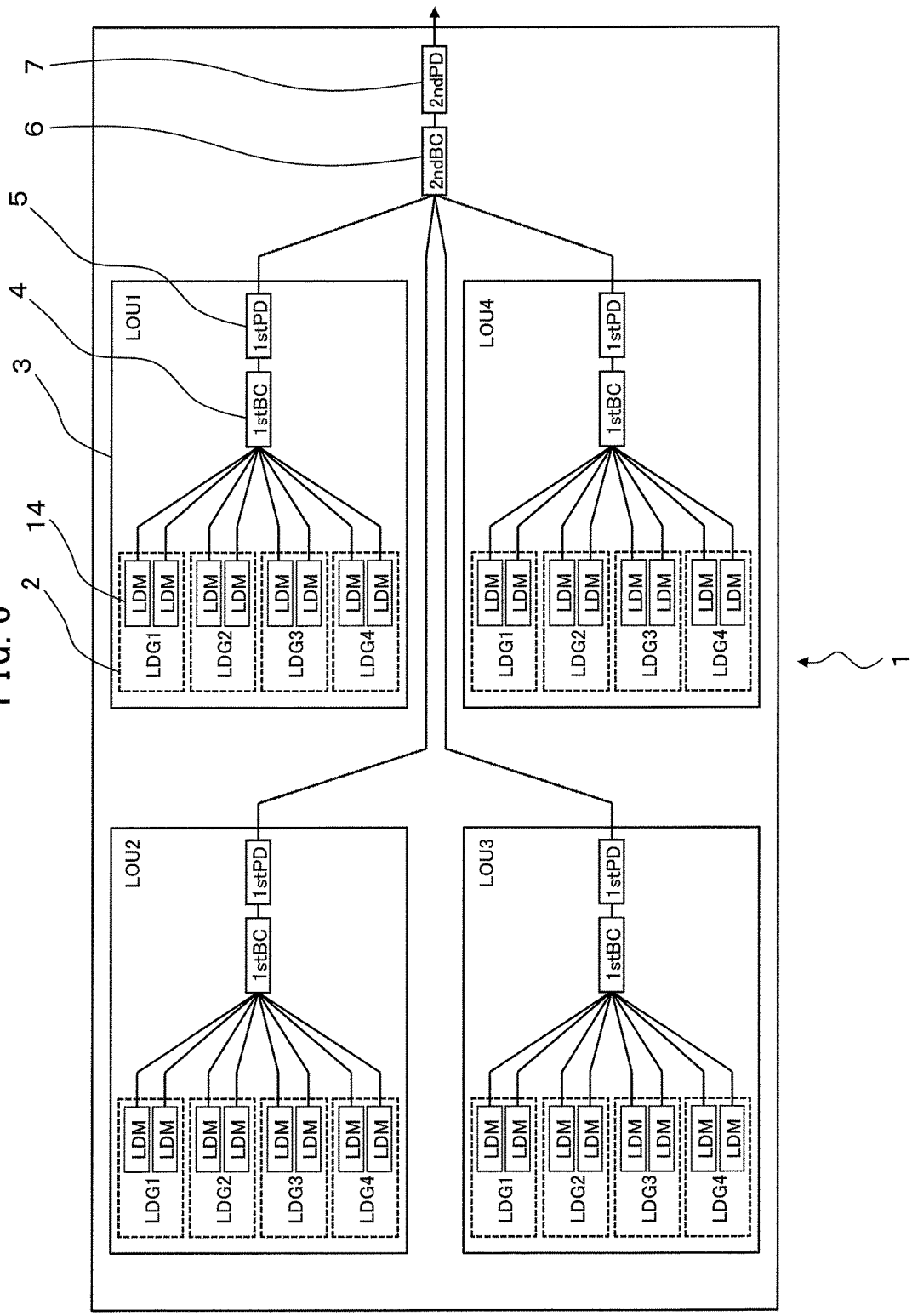
FIG. 6 is a view showing the configuration of a laser system according to another embodiment.

FIG. 6 shows an example of the configuration of the laser system 1 in the case of direct utilization of the laser light emitted from laser diode modules 14. In the illustrated embodiment, each laser diode module group 2 includes two laser diode modules 14.

Figure 7:
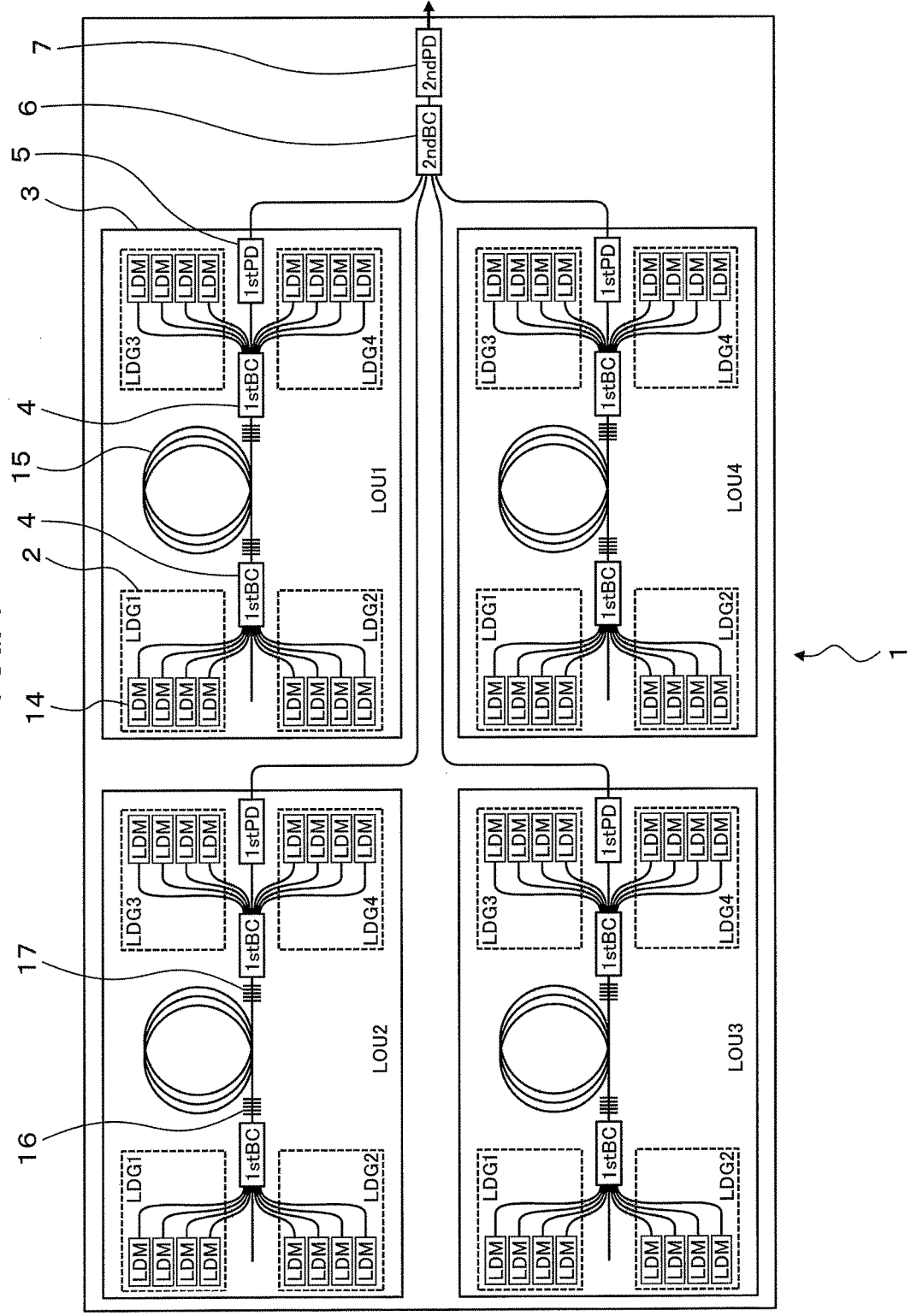
FIG. 7 is a view showing the configuration of a laser system according to another embodiment.

The laser system 1 shown in FIG. 7 is a fiber laser utilizing laser light emitted from the laser diode modules 14 as excitation light sources. The laser system 1 further includes optical fibers 15 in which an active element is doped, high reflectivity fiber Bragg gratings 16, and low reflectivity fiber Bragg gratings 17. In the illustrated embodiment, each laser diode module group 2 includes four laser diode modules 14. In FIG. 6 and FIG. 7, as will be understood if compared with FIG. 1, the power supply parts and control part etc. are omitted and only the optical systems are shown.

The photodetection part has the configuration desired in accordance with the mode of propagation of the laser light. For example, when the laser light is propagated through space, the photodetection part may be configured so that part of the laser beam taken out by a partial reflector is made to be incident on the photodetection part. When the laser light is propagated through a fiber, the photodetection part may be configured to detect the light leaked from a location where the covering part of the fiber has been removed. Alternatively, the photodetection part may be configured to take out and detect part of the laser light by a beam splitter.

Referring to FIG. 8 to FIG. 11, a second embodiment will be explained. The laser system according to the present embodiment is configured in the same way as the laser system 1 according to the above-mentioned first embodiment. Only the method of driving the laser diode module groups 2 differs from the first embodiment.

Figure 8:
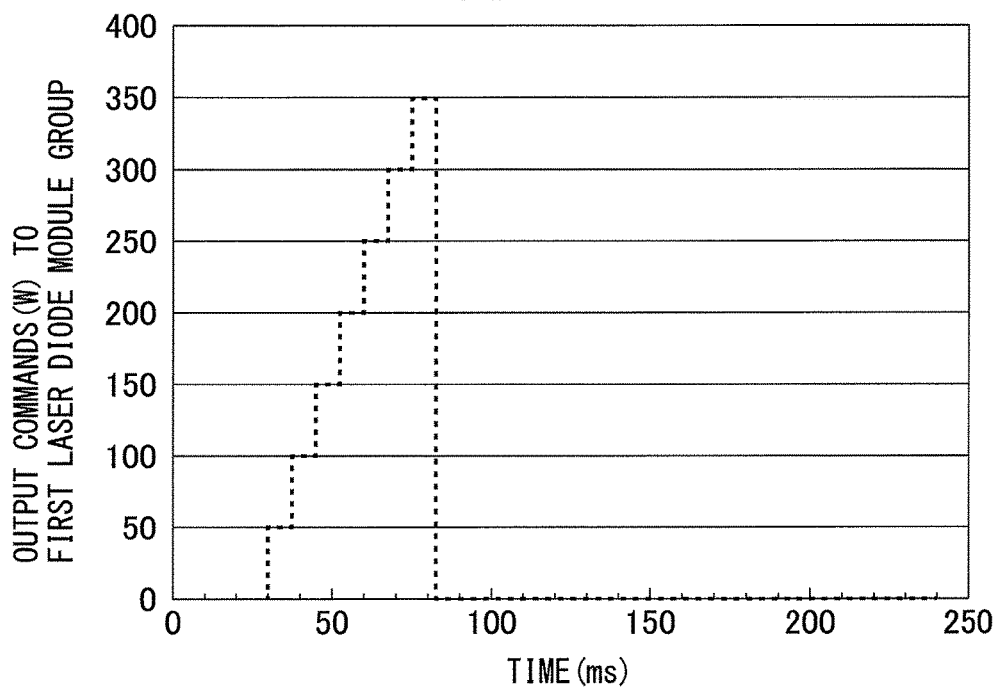
FIG. 8 is a view showing an output command to a first laser diode module group in a second embodiment.
Figure 9:
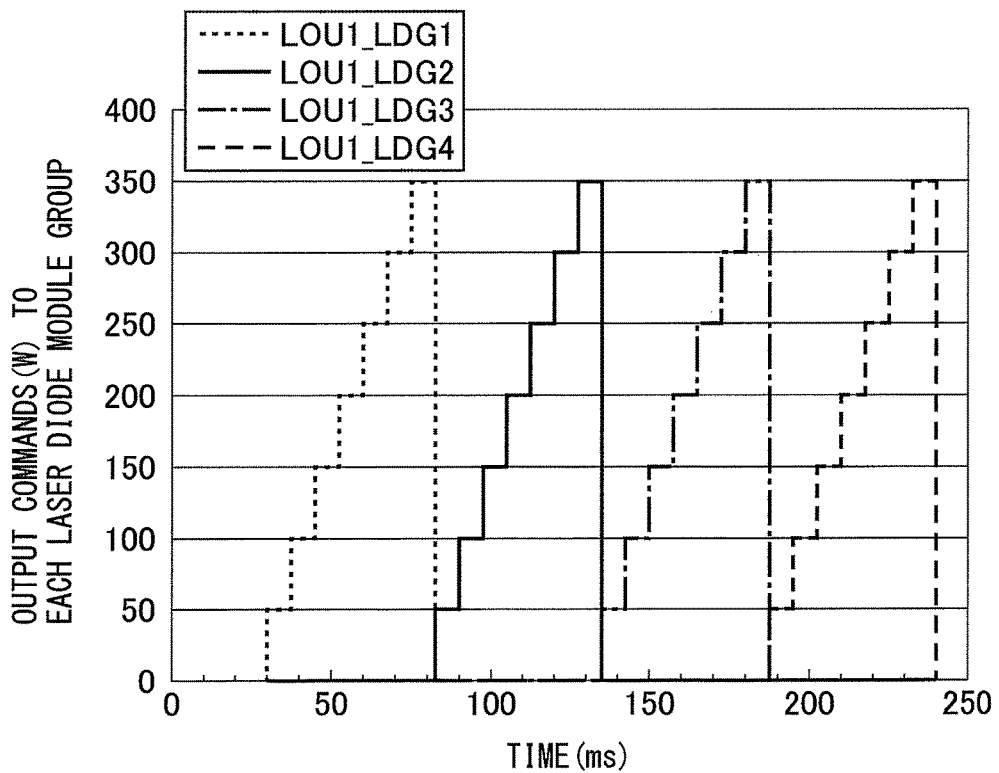
FIG. 9 is a view showing output commands to first to fourth laser diode module groups in the second embodiment.

FIG. 8 and FIG. 9 are views corresponding to FIG. 2 and FIG. 3. As will be understood if referring to FIG. 8 and FIG. 9, the output commands from the control part 10 are designed to increase in stages over a predetermined drive time.

Figure 10:
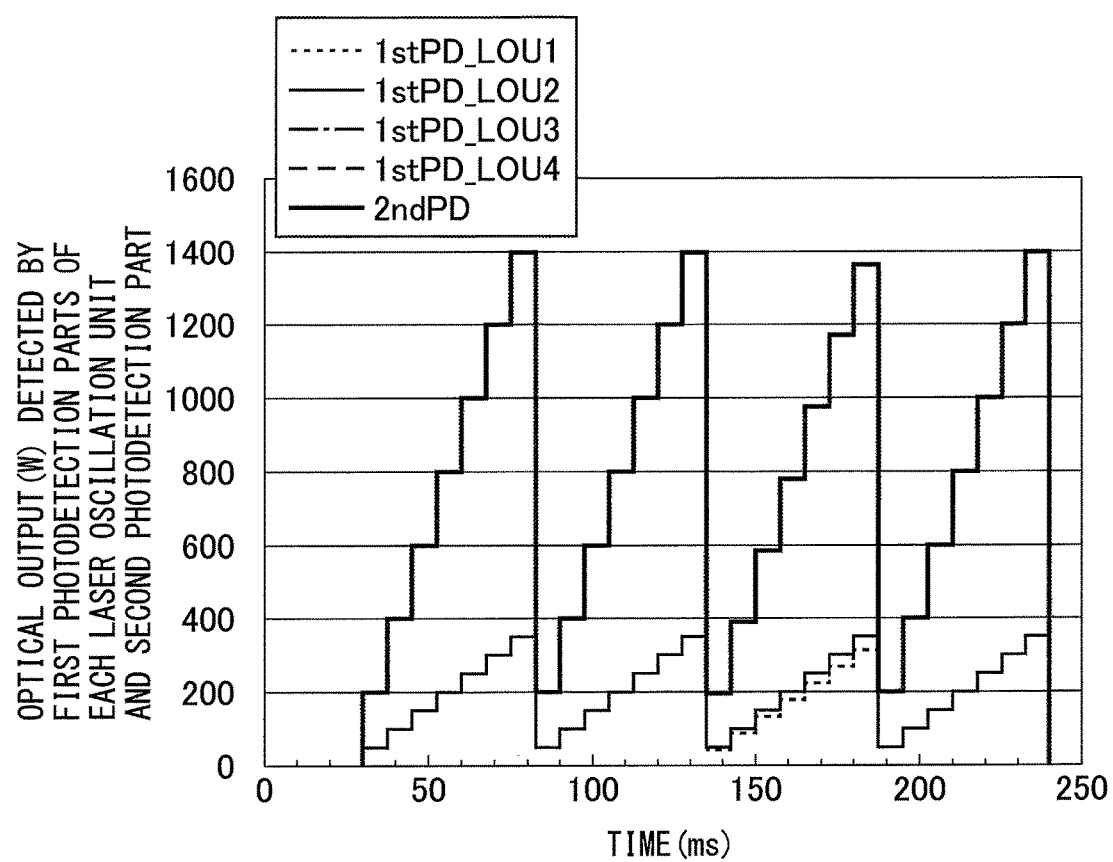
FIG. 10 is a view showing optical output obtained from detection values of a first photodetection part and second photodetection part in the second embodiment.

FIG. 10 shows the optical output obtained from detection values of the first photodetection parts 5 and optical output obtained from the detection value of the second photodetection part 7 in the case where the output commands shown in FIG. 9 are simultaneously given to the first to fourth laser diode module groups LDG1 to LDG4 of the laser oscillation units 3 in each laser oscillation unit 3.

In the example shown in FIG. 10, in the time of about 135 ms to about 187 ms during which the third laser diode module group LDG3 is driven, the detection value of the first photodetection part 5 of the first laser oscillation unit LOU1 and the detection value of the second photodetection part 7 both fall about 10% from the output command. This suggests the possibility of deterioration of the optical output characteristics of the laser diode module group LDG3 driven third in the first laser oscillation unit LOU1.

Figure 11:
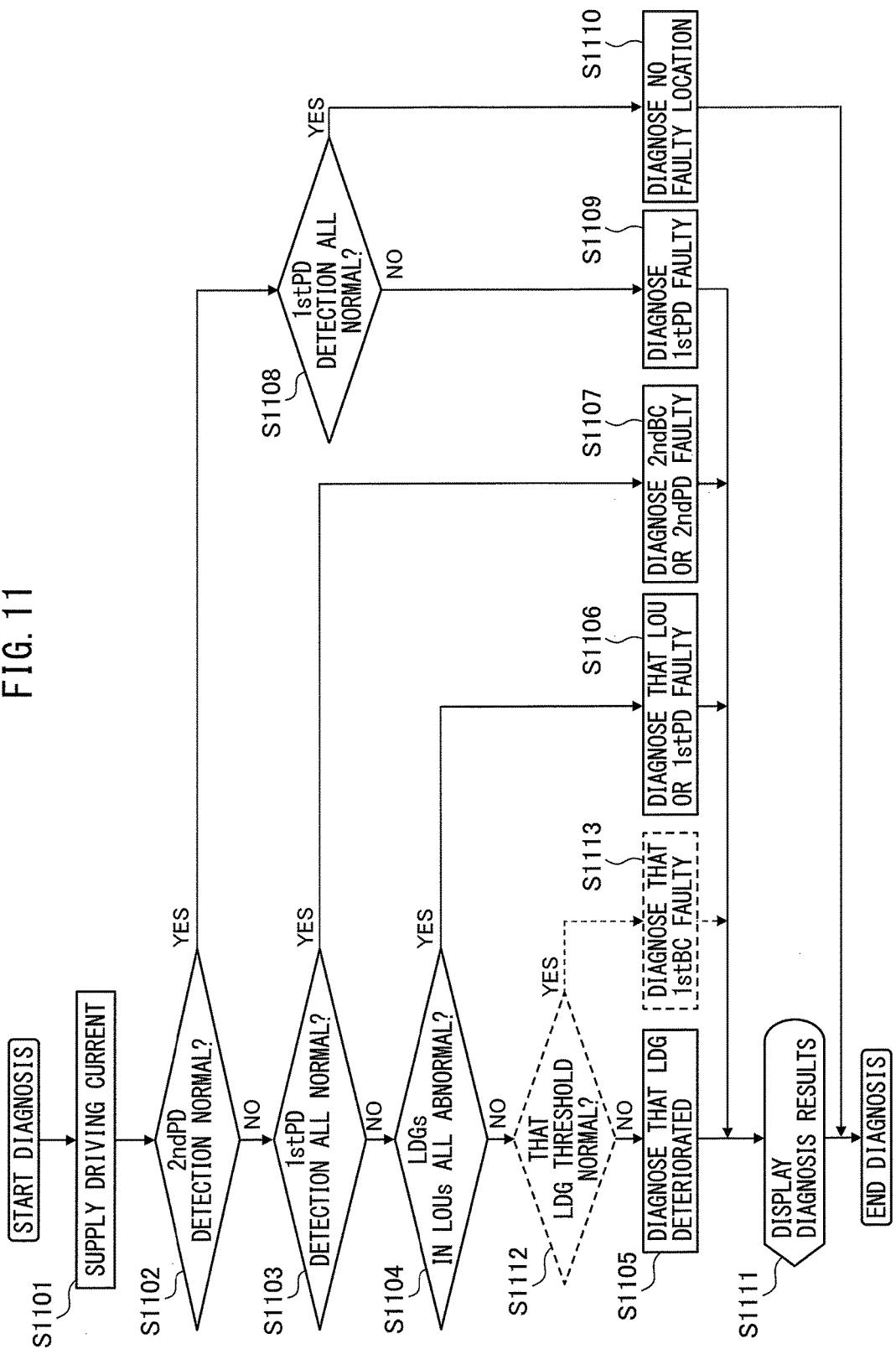
FIG. 11 is a flow chart showing a fault diagnosis process performed in the laser system according to the second embodiment.

FIG. 11 is a flow chart of diagnosis processing performed in accordance with this embodiment. Steps S1101 to S1111 of FIG. 11 are similar to steps S501 to S511 of FIG. 5, so only the processing of the added steps S1112 and step S1113 will be explained.

If at step S1104 it is judged that at least one laser diode module group is normal, the routine proceeds to step S1112. At step S1112, it is judged if the threshold current of a laser diode module group judged abnormal is normal.

When the result of judgment at step S1112 is negative, the routine proceeds to step S1105. On the other hand, when the result of judgment at step S112 is affirmative, the routine proceeds to step S1113 where the judging part 11 judges that the first optical coupling part 4 is faulty. That is, if the threshold current is normal even when the optical output is falling, it is guessed that the laser diode module group has not deteriorated in characteristics.

According to the present embodiment, information relating to the threshold current is utilized for the fault diagnosis, so more accurate fault diagnosis can be performed.

Note that, in another embodiment, instead of increasing an output command in stages, an output command may be increased continuously. Alternatively, instead of making an output command gradually increase, the driving current given in accordance with the output command may also be made to gradually increase.

Figure 12:
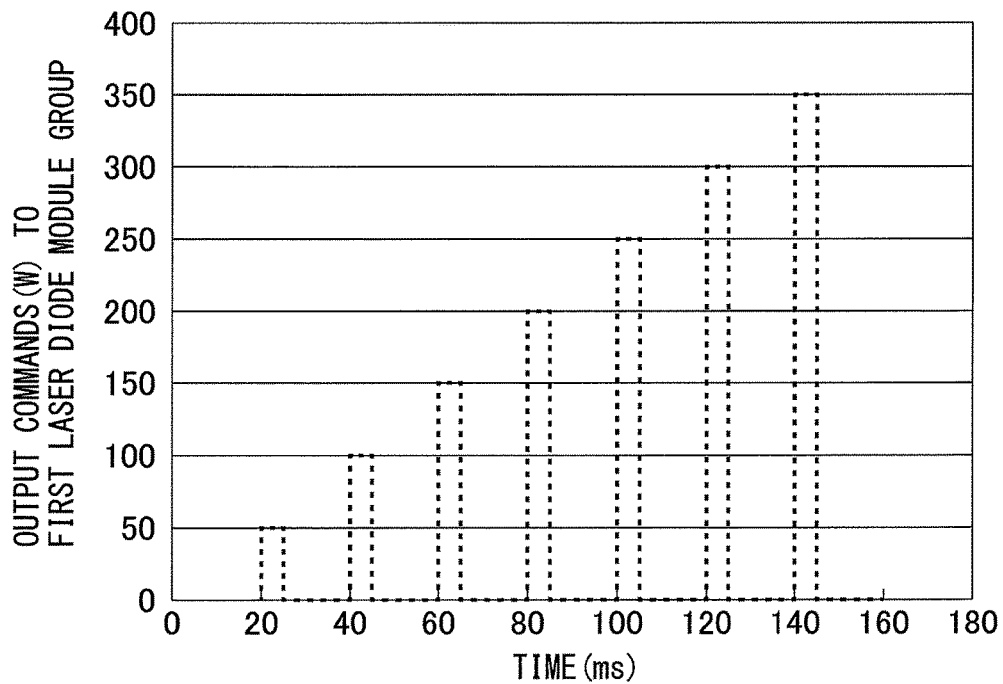
FIG. 12 is a view showing an output command to a first laser diode module group in a third embodiment.
Figure 13:
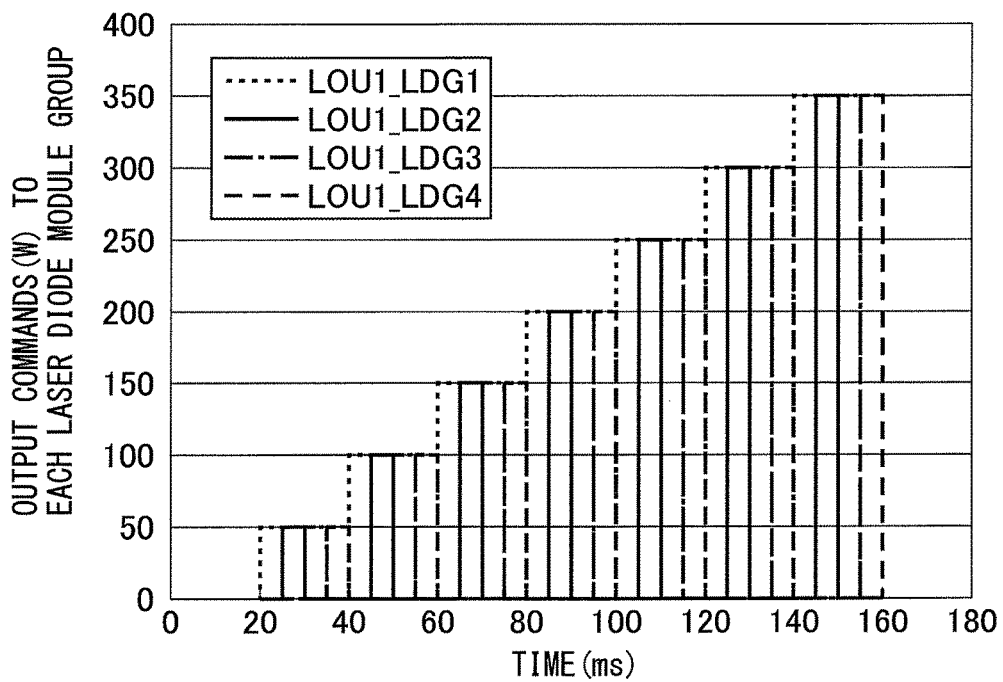
FIG. 13 is a view showing output commands to first to fourth laser diode module groups in the third embodiment.
Figure 14:
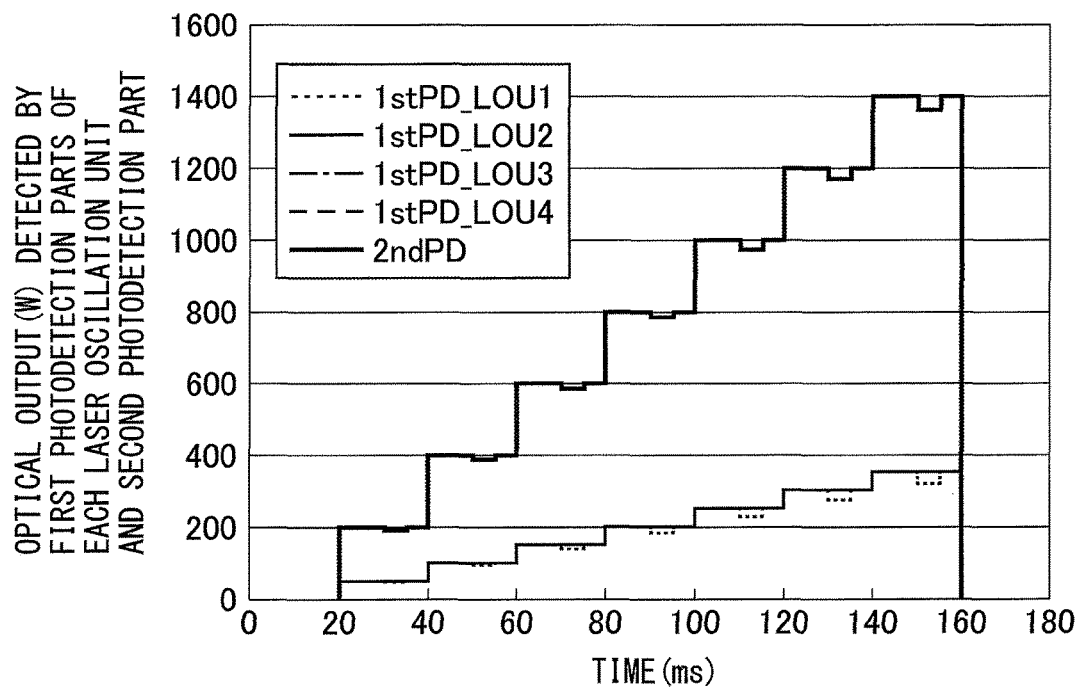
FIG. 14 is a view showing optical output obtained from detection values of a first photodetection part and second photodetection part in the third embodiment.

Referring to FIG. 12 to FIG. 14, a third embodiment will be explained. According to this embodiment, the laser system according to the present embodiment has a configuration similar to the laser system 1 according to the above-mentioned first embodiment, but the method of driving the laser diode module groups 2 differs from the first embodiment.

FIG. 12 shows the output command given to the first laser diode module group LDG1 of each laser oscillation unit 3. As shown in FIG. 12, the output command given to the first laser diode module group LDG1 is increased in stages at predetermined time intervals.

FIG. 13 shows the output commands given to the first to fourth laser diode module groups LDG1 to LDG4 of each laser oscillation unit 3 in a superposed state. As illustrated, the output commands are designed so that the drive times of the first to fourth laser diode module groups LDG1 to LDG4 are offset from each other.

The control part 10 gives driving instruction so as to supply driving currents corresponding to the output commands to the power supply parts 8 in accordance with the optical output characteristics recorded at the recording part 9.

FIG. 14 shows the optical output obtained from detection values of the first photodetection parts 5 and the optical output obtained from detection value of the second photodetection part 7 in the case where the output commands shown in FIG. 13 are simultaneously given to the laser oscillation units 3 at the first to fourth laser diode module groups LDG1 to LDG4 in each laser oscillation unit 3. In this case, the detection value of the first photodetection part 5 of the first laser oscillation unit LOU1 and the detection value of the second photodetection part become smaller by about 10% from the output commands.

In the case of the example of FIG. 14, deterioration of the characteristics of the third laser diode module group of the first laser oscillation unit is predicted. However, there is also the possibility of another reason, for example, deterioration of characteristics or abnormality of a photodetection part or optical coupling part etc. Therefore, in the present embodiment, fault diagnosis may be automatically performed in accordance with the flow chart of FIG. 11.

In the present embodiment, the change of a detection value of a photodetection part over time is relatively small, so it is possible to prevent the detection precision from falling due to the time constant of the photodetection part. Note that, the drive time of the first laser diode module group where the change of optical output along with time becomes relatively large may be adjusted to become relatively long.

In the above-mentioned embodiment, for simplification, the power loss of the laser light at the second optical coupling part 6 was ignored, but in actuality, usually the rate of loss differs for each input end of laser light. Therefore, to better improve the precision of the fault diagnosis, it is also possible to record in advance the data of the rates of loss of the individual input ends at the recording part 9 and use the data of the rates of loss as the basis to correct the driving currents supplied from the power supply parts 8 to the laser diode module groups 2 or correct the detection value of the second photodetection part.

Figure 15:
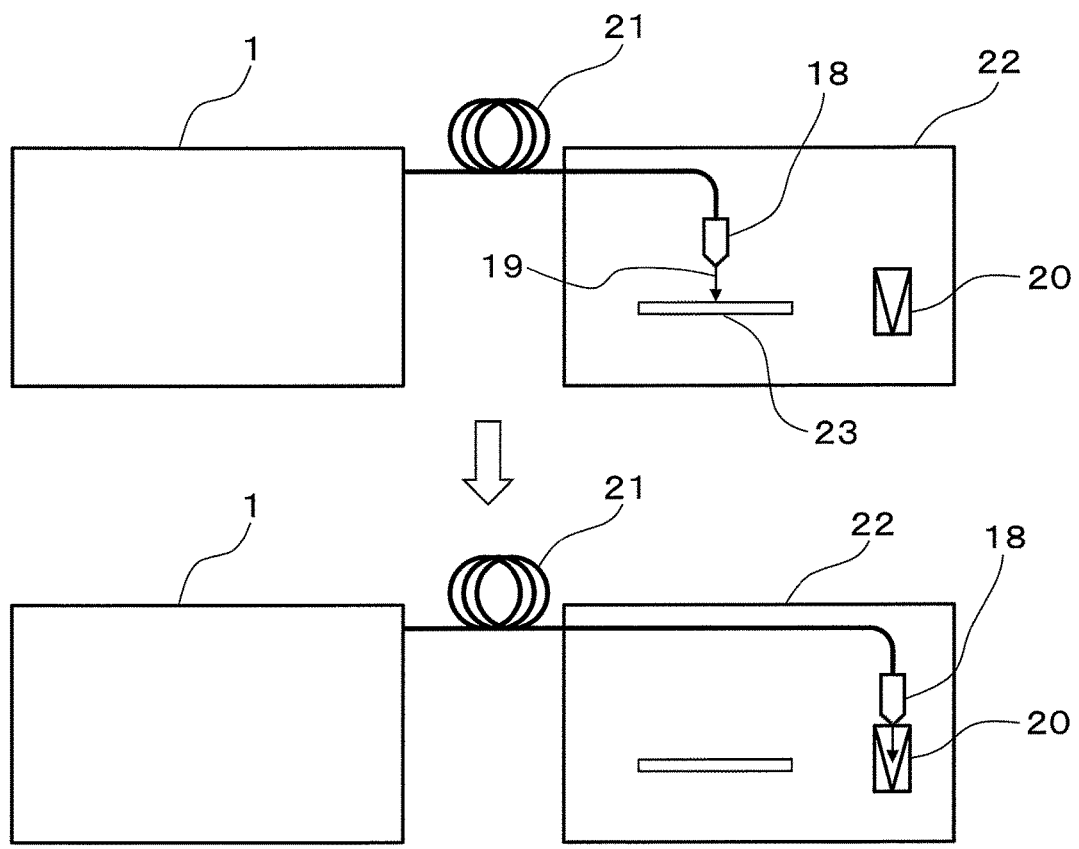
FIG. 15 is a view showing the configuration of a laser system according to a fourth embodiment.

FIG. 15 shows the configuration of a laser system 1 according to the fourth embodiment. At the top of FIG. 15, the laser system 1 in the state of processing a workpiece 23 by laser beam 19 is shown. At the bottom of FIG. 15, the laser system 1 in the state where a processing head 18 of the laser light emission end connected to the laser system 1 through an optical fiber 21 moves to a retracted position near a light absorbing part 20 is shown.

When the processing end 18 is placed at the retracted position, the laser beam 19 emitted from the processing head 18 is absorbed by the light absorbing part 20. Therefore, when the laser system 1 is performing fault diagnosis, it is possible to prevent the laser beam 19 from being emitted in an unpredicted direction and from leaking out from the clearances of the light shielding cover 22. Further, it is possible to prevent the return light resulting from the laser beam 19 emitted from the processing head 18 being reflected and made incident on the processing head 18 from causing the reliability of the detection value of a photodetection part to fall.

In a modification of the fourth embodiment, the laser system 1 may include a third photodetection part measuring the optical output of laser beam incident on the light absorbing part 20. In the laser system 1 including the third photodetection part, when only the detection value of the second photodetection part 7 falls, it is possible to compare the detection value of the second photodetection part 7 and the detection value of the third photodetection part and identify if the cause of deterioration of the characteristics is the second optical coupling part 6 or the second photodetection part 7.

Figure 16:
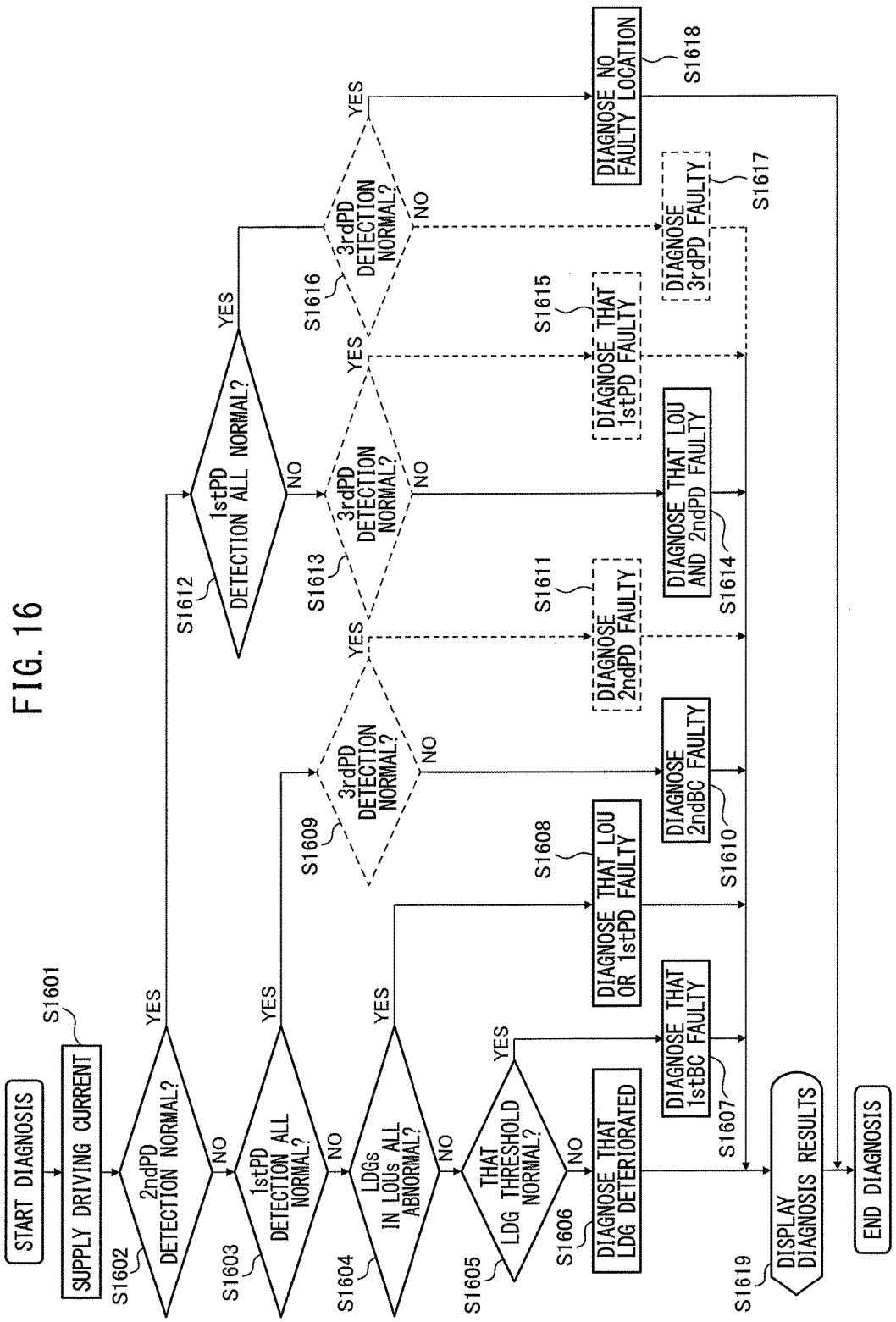
FIG. 16 is a flow chart showing a fault diagnosis process performed in the laser system according to a modification of the fourth embodiment.

FIG. 16 is a flow chart of fault diagnosis performed by the laser system 1 according to this modification. As will be understood from a comparison with the flow chart of FIG. 11, steps S1609 to S1611 and steps S1613 to S1618 shown by the broken lines are added. According to this modification, when the results of detection of a first photodetection part 5 and the results of detection of the second photodetection part 7 contradict each other, it can be identified that one of the first photodetection part 5 and the second photodetection part 7 is faulty.

Figure 17:
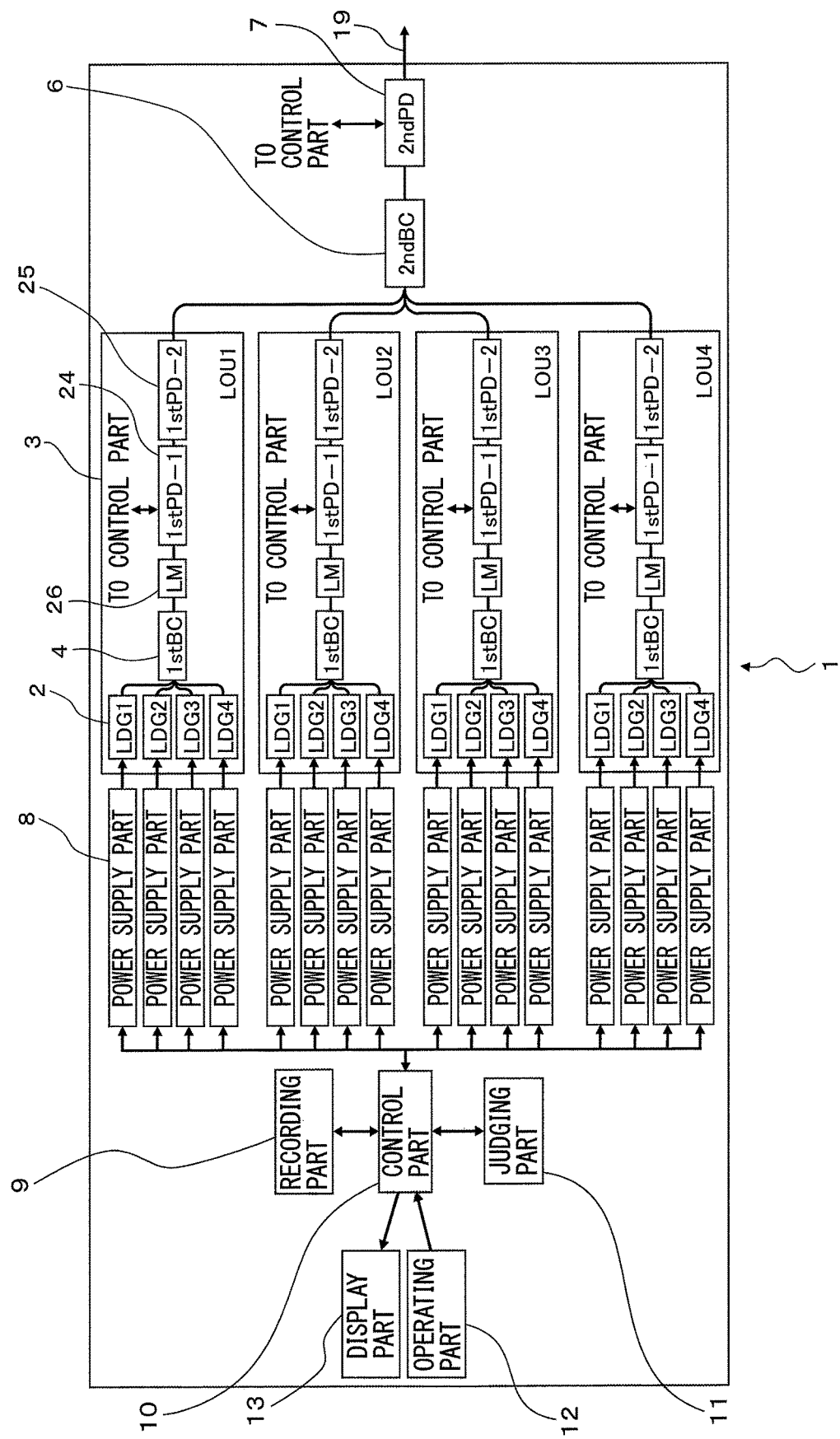
FIG. 17 is a view showing the configuration of a laser system according to a fifth embodiment.

FIG. 17 shows the configuration of a laser system 1 according to the fifth embodiment. According to this embodiment, each laser oscillation unit 3 includes two first photodetection parts 24, 25 provided in series with each other, that is, the "1stPD-1" and "1stPD-2".

According to a laser system including a plurality of first photodetection parts 24, 25, when the optical output from the laser oscillation unit 3 falls, it can be identified if the cause lies in the first optical coupling part 4 or in the first photodetection parts 24, 25.

A laser system 1 including the two first photodetection parts 24, 25 was explained, but in another embodiment, the laser system 1 may include three or more first photodetection parts.

Further, in another embodiment, the laser system may include two or more second photodetection parts provided in series with each other. According to a laser system including a plurality of second photodetection parts, it is possible to enjoy the advantages similar to the inclusion of the third photodetection part. That is, when the detection value of the second photodetection part falls, it can be identified if the cause lies in the second optical coupling part 6 or in the second photodetection part.

Figure 18:
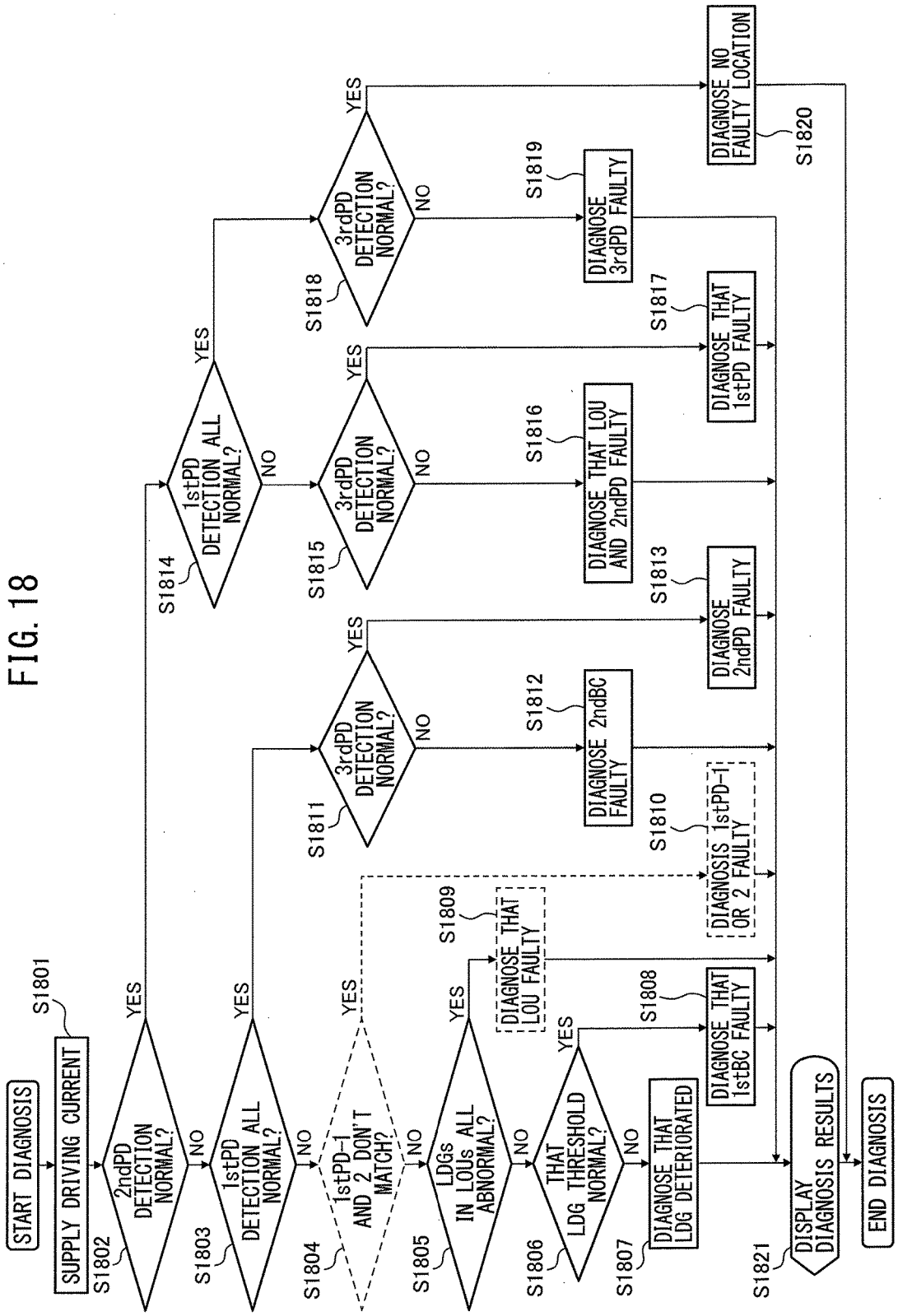
FIG. 18 is a flow chart showing a fault diagnosis process performed in the laser system according to the fifth embodiment.

FIG. 18 shows a flow chart of the fault diagnosis performed in the laser system 1 according to the fifth embodiment. If at step S1804 it is judged that the results of detection of one first photodetection part 24 and the results of detection of the other first photodetection part 25 do not match, the routine proceeds to step S1810 where it is judged that one of the first photodetection parts 24, 25 is faulty.

Figure 19:
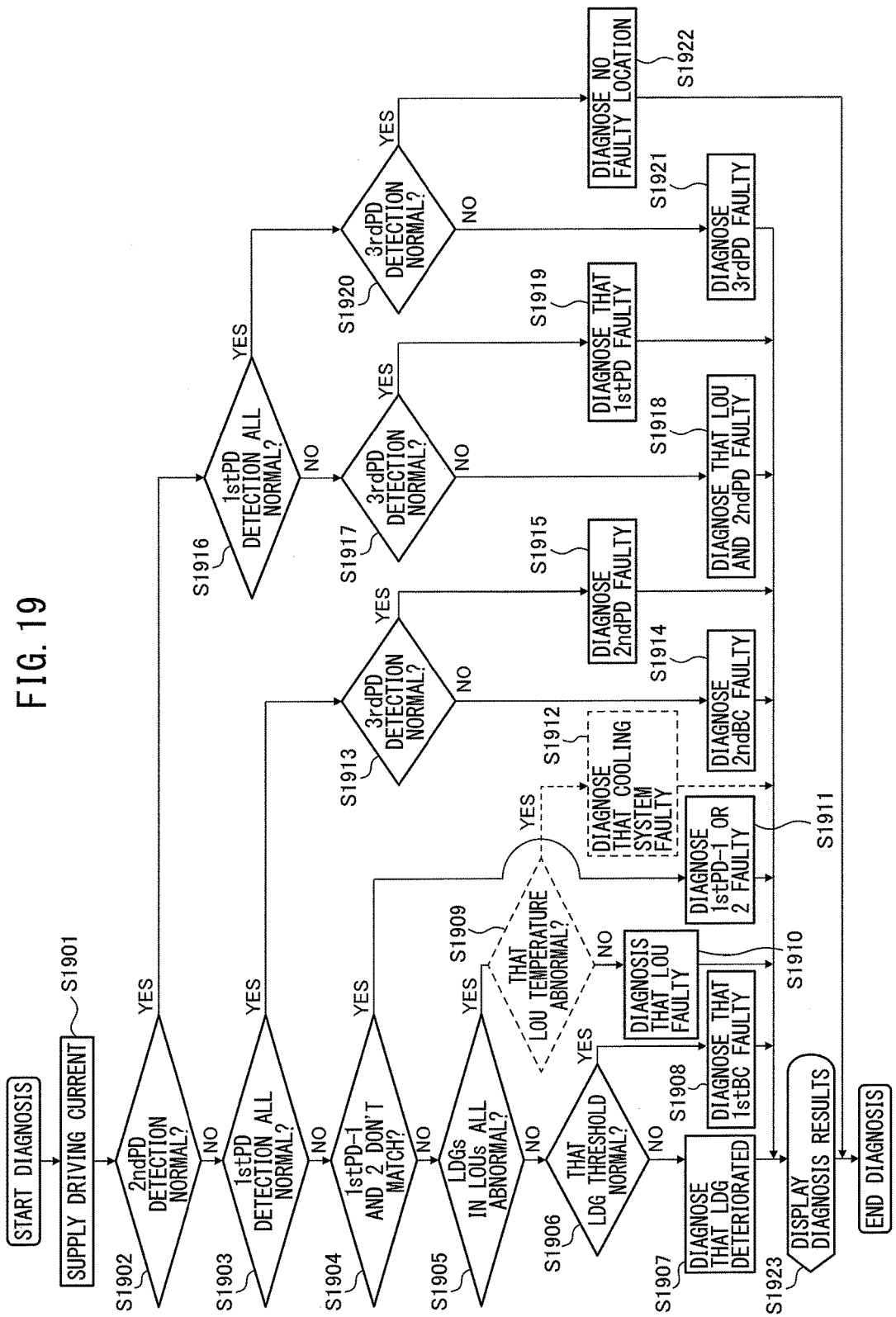
FIG. 19 is a flow chart showing a fault diagnosis process performed in the laser system according to a sixth embodiment.

FIG. 19 shows a flow chart of the diagnosis processing performed by the laser system according to a sixth embodiment. The laser system according to the present embodiment further includes a temperature detector detecting the temperature of a cooling plate on which the laser diode module is placed.

According to the present embodiment, it becomes possible to identify if the cause of the fall of the optical output lies in the cooling apparatus according to whether the temperature of the cooling plate detected by the temperature detector is abnormal or not.

FIG. 19 shows a flow chart of the diagnosis processing performed by the laser system according to the present embodiment. At step S1909, it is judged if the temperature detected by the temperature detector is abnormal. Further, if the detected temperature is abnormal, it is judged that the cooling apparatus is faulty.

In another embodiment, the laser system may be configured to automatically perform the diagnosis processing at preset times. By periodically performing fault diagnosis, it is possible to prevent a fault in a component from causing the laser system to suddenly stop.

In still another embodiment, the laser system may be configured so that the recording part 9 records the latest optical output characteristics based on the results of detection of the first photodetection part. The optical output characteristics may overwrite previous data or be recorded separately from previous data. Further, the time of acquisition of the optical output characteristics may be recorded at the same time.

According to the above-mentioned embodiment, by recording the optical output characteristics of the individual laser diode module groups, it becomes possible to easily compare to what extent the laser diode module groups have deteriorated compared to when previously diagnosed. If storing past records, it becomes possible to perform a maintenance process as needed in accordance with the state of advance of deterioration before a component of the laser system becomes faulty.

In the above-mentioned embodiments, when it was judged that a component of the laser system was faulty, the display part 13 was used to display fault information. However, when the extent of the deterioration of characteristics of a laser diode module group is small, instead of notifying fault information to the user, it is also possible to lower the driving current supplied to that laser diode module group.

Above, various embodiments of the present invention were explained, but a person skilled in the art would recognize that other embodiments as well may be used to realize the actions and effects intended by the present invention. In particular, the components of the embodiments explained above can be deleted or replaced without departing from the scope of the present invention and known means can be further added. Further, the fact that the features of the plurality of embodiments which are explicitly or implicitly disclosed in this specification can also be freely combined so as to work the present invention is self evident to a person skilled in the art.

According to the laser system according to the present invention, when performing the fault diagnosis process, two or more laser oscillation units among the plurality of laser oscillation units are simultaneously supplied with driving current in a manner so that the drive times of the plurality of laser diode module groups in each laser oscillation unit do not overlap. Due to this, it becomes possible to complete the fault diagnosis process in a short time and as a result becomes possible to perform the fault diagnosis process more frequently and thereby becomes possible to effectively monitor the status of the laser system.

The invention claimed is:

1. A laser system comprising a plurality of laser oscillation units and configured to combine laser light emitted from the plurality of laser oscillation units for emission to the outside, wherein
    each of the laser oscillation units includes
    a plurality of laser diode module groups each including at least one laser diode module acting as a light source or excitation light source,
    a first optical coupling part combining the laser light emitted from the plurality of laser diode module groups, and
    at least one first photodetection part detecting the output power of laser light combined by the first optical coupling part,
    the laser system comprises
    a second optical coupling part combining the laser light emitted from the plurality of laser oscillation units,
    at least one second photodetection part detecting the output of the laser light combined by the second optical coupling part,
    power supply parts that are able to supply driving current to the plurality of laser diode module groups independently from each other,
    a recording part recording optical output characteristics showing the relationship between driving current and output power of laser light at each of the laser diode module groups,
    a control part commanding driving conditions showing the driving current to be supplied to each of the laser diode module groups to the power supply parts,
    a judging part judging any fault or deterioration of the components of the laser system, and
    an operating part used for setting the driving conditions, and
    the judging part is configured to judge, simultaneously for at least two laser oscillation units among the plurality of laser oscillation units, any fault or deterioration of the components of the laser system based on the results of detection of the first photodetection part and the second photodetection part when successively driving the plurality of laser diode module groups included in each of the laser oscillation units so that their drive times do not overlap.

2. The laser system according to claim 1, wherein the control part is configured to set the driving conditions so that the driving current supplied to each of the laser diode module groups changes continuously or in stages when the judgment by the judging part is performed.

3. The laser system according to claim 1, wherein the control part is configured to set the driving conditions so that a drive cycle for successively driving the plurality of laser diode module groups included in each of the laser oscillation units so that their drive times do not overlap is performed several times while changing the driving current supplied to each of the laser diode module groups when judgment by the judging part is performed.

4. The laser system according to claim 1, wherein when judgment by the judging part is performed, a laser beam emitting end of the laser system is configured to move to a retracted position so that the laser beam emitted from the laser system to the outside is absorbed at a light absorbing part.

5. The laser system according to claim 4, wherein the light absorbing part includes a third photodetection part measuring the optical output of laser beam incident on the light absorbing part.

6. The laser system according to claim 1, wherein each laser oscillation unit comprises a plurality of said first photodetection parts.

7. The laser system according to claim 1, comprising at least two said second photodetection parts.

8. The laser system according to claim 1, wherein
    each of the laser oscillation units further comprises
    a cooling plate cooling the at least one laser diode module and
    a temperature detector detecting the temperature of the cooling plate, and
    the judging part is configured to judge any fault or deterioration of the components of the laser system based further on the results of detection of the temperature detector.

9. The laser system according to claim 1, wherein the judging part is configured to judge any fault or deterioration of the components of the laser system at a predetermined time period.

10. The laser system according to claim 1, wherein the recording part is configured so that the optical output characteristics recorded by the recording part are overwritten by using optical output characteristics newly acquired when judgment by the judging part is performed.

11. The laser system according to claim 1, wherein the recording part is configured to record additional optical output characteristics newly acquired when judgment by the judging part is performed.

12. The laser system according to claim 11, wherein the recording part is configured to record the additional optical output characteristics along with the acquisition time.

13. The laser system according to claim 1, further comprising a display part displaying results of judgment by the judging part.

* * * * *